(12) United States Patent
Kums (10) Patent No.: US 10,034,337 B2
(45) Date of Patent: Jul. 24, 2018

(54) LED DEVICE HAVING INDIVIDUALLY ADDRESSABLE LED MODULES

(71) Applicant: KONINKLIJKE PHILIPS N.V., Eindhoven (NL)

(72) Inventor: Gerard Kums, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/526,987

(22) PCT Filed: Nov. 12, 2015

(86) PCT No.: PCT/EP2015/076459
§ 371 (c)(1),
(2) Date: May 15, 2017

(87) PCT Pub. No.: WO2016/079005
PCT Pub. Date: May 26, 2016

(65) Prior Publication Data
US 2017/0318636 A1    Nov. 2, 2017

(30) Foreign Application Priority Data
Nov. 20, 2014    (EP) .................................... 14193989

(51) Int. Cl.
*H05B 37/02*        (2006.01)
*H05B 33/08*        (2006.01)
(Continued)

(52) U.S. Cl.
CPC ....... *H05B 33/0827* (2013.01); *H01L 33/387* (2013.01); *H01L 33/58* (2013.01);
(Continued)

(58) Field of Classification Search
CPC .............. H05B 33/0827; H05B 33/083; H05B 33/0833; H05B 33/0842; H05B 33/0845;
(Continued)

(56) References Cited

U.S. PATENT DOCUMENTS 4,323,895 A    4/1982    Coste
6,406,172 B1    6/2002    Harbers et al.
(Continued)

FOREIGN PATENT DOCUMENTS

EP    1995995 A1    11/2008

OTHER PUBLICATIONS

EPO as ISA, "International Search Report and Written Opinion" dated Feb. 1, 2016 from International Application No. PCT/EP2015/076459, filed Nov. 12, 2015, 9 pages.
(Continued)

*Primary Examiner* — Tung X Le
*Assistant Examiner* — Henry Luong
(74) *Attorney, Agent, or Firm* — Brian D. Ogonowsky; Patent Law Group LLP (57) ABSTRACT

The invention provides an interconnected string of three LED modules, having internal and external connections such that each LED in the string is fully individually addressable. LED biases and interconnects are oriented and configured such that individual addressability is achieved without the need for direct external signal connections to each LED in the string. Consequently embodiments are provided comprising pluralities of strings, arranged so as to form an array of LED modules, wherein wiring tracks running beneath, or along the intermediary spaces between, rows of LEDs are not required. Hence are provided LED devices comprising an array of individually addressable LED modules, having reduced spacing between rows and columns, and having optimal thermal path perpendicularly
(Continued)

across the substrate layer. Provided devices have improved heat dissipation and greater achievable LED array density. Also provided are embodiments comprising one or more lens arrangements, suitable, for example, for adaptive beam-shaping applications.

19 Claims, 3 Drawing Sheets

(51) Int. Cl.
    *H01L 33/62* (2010.01)
    *H01L 33/38* (2010.01)
    *H01L 33/64* (2010.01)
    *H01L 33/58* (2010.01)
    *H05B 33/06* (2006.01)

(52) U.S. Cl.
    CPC ............ *H01L 33/62* (2013.01); *H01L 33/642* (2013.01); *H05B 33/06* (2013.01); *H05B 33/083* (2013.01)

(58) Field of Classification Search
    CPC .... H05B 37/02; H05B 37/029; H05B 37/032; H05B 37/036; H01L 33/387; H01L 33/42; H01L 33/48; H01L 33/58; H01L 33/64; H01L 33/62
    See application file for complete search history.

(56) References Cited

U.S. PATENT DOCUMENTS

| | | | |
|---|---|---|---|
| 9,374,859 B2* | 6/2016 | Pop | H05B 33/0815 |
| 2009/0050907 A1* | 2/2009 | Yuan | H05B 33/0821 |
| | | | 257/88 |
| 2009/0168419 A1* | 7/2009 | Daimon | F21V 5/043 |
| | | | 362/235 |
| 2015/0069914 A1* | 3/2015 | Pop | H05B 33/0815 |
| | | | 315/113 |

OTHER PUBLICATIONS

European Search Report dated Jun. 9, 2015 from European Patent Application No. 14193989.2 filed Nov. 20, 2015, 4 pages.

* cited by examiner

LED DEVICE HAVING INDIVIDUALLY ADDRESSABLE LED MODULES

CROSS-REFERENCE TO RELATED APPLICATIONS

The present application is a § 371 application of International Application No. PCT/EP2015/076459 filed on Nov. 12, 2015 and entitled "LED DEVICE HAVING INDIVIDUALLY ADDRESSABLE LED MODULES", which claims the benefit of European Patent Application No. 14193989.2 filed on Nov. 20, 2014. International Application No. PCT/EP2015/076459 and European Patent Application No. 14193989.2 are incorporated herein.

FIELD OF THE INVENTION

The invention relates to an LED lighting unit adapted for individual addressability of LEDs.

BACKGROUND OF THE INVENTION

Light emitting diodes (LEDs) are increasingly used for a variety of lighting applications—and in particular are increasingly employed within automotive front lighting. LEDs offer a number of advantages over traditional (incandescent or fluorescent) light sources, including long lifetime, high lumen efficiency, low operating voltage and fast modulation of lumen output.

LEDs also open up additional functionalities within automotive lighting. In particular, pluralities of LEDs employed together within a single lighting unit, offer the possibility for adaptive beam shaping. An array of LEDs, for example, having individual or group addressability may be employed to selectively generate beams of differing shapes, angles and profiles. Used, for example, in combination with external beam-shaping optics, highly directional, high contrast front beams may be generated with the additional capability to be dynamically adapted in real time to realise different shapes, directionalities or angular widths.

Adaptive beam shaping of this sort requires an array of LED modules which can be activated or deactivated individually, or within small subgroups—though individual addressability is preferable in virtue of the greater flexibility which it affords. Typically individual addressability of LEDs within an array is achieved through providing wiring tracks which run along the intermediary spaces between array rows and/or columns, in order to reach and provide individual currents to every LED across the expanse of the array However, to achieve maximal performance in such applications, it is preferable that the light intensity is maximised, requiring, for a given number of light sources of known output power, that the total area over which light is emitted be minimised. For an array of LED modules, minimised light-emitting area requires the spacing between adjacent modules to be as small as possible.

Wiring tracks running along (i.e. parallel and coincident with) spaces between array rows and/or columns, as utilised by state of the art devices to enable individual addressability, consume valuable space, thereby limiting the achievable density of the array, and hence the light intensity of the device.

One solution to this problem has been to instead route some or all of the individual connecting tracks, not between the LED modules, but below them, as a separate layer incorporated within the substrate itself (see for example FIG. 4).

However, multi-layer wiring solutions of this sort carry the significant disadvantage of substantially limiting heat dissipation capacity within the device. Within a closely packed array of LEDs, heat cannot spread laterally (in an X-Y plane), due to the close proximity of neighbouring LEDs, and hence must be dissipated 'vertically', through the substrate layer, typically to a dedicated heat-sink layer below. This requires optimal thermal path between the LED modules and the heat sink. One or more wiring layers running through the substrate layer impede this thermal path, significantly diminishing the thermal conductivity between the LEDs and the heat-sink. Additionally such wiring layers also increase costs, since a multilayer-type substrate is required, and also risk compromising reliability, since vias are required for connecting to internal layers.

Desired, therefore, would be lighting unit comprising a closely arranged array of LEDs, having a wiring scheme which facilitates individual addressability of component LEDs, but while avoiding (or at least greatly reducing) the need for wiring tracks which run either below, or along the intermediary spaces between, LEDs thereby maximising heat dissipation rate to the heat sink, while also minimising total incurred area footprint.

SUMMARY OF THE INVENTION

The invention is defined by the claims.

According to an aspect of the invention, there is provided a LED unit comprising:

a string of LED modules including:

a pair of terminal LED modules at opposite ends of said string, each of said terminal LED modules comprising two external terminals connected to an anode and cathode respectively of the LED module; and an intermediate LED module having an anode connected to the cathode of one of the terminal LED modules and a cathode connected to the anode of the other of the terminal LED modules, such that any combination of said LED modules may be switched on by providing a current between a selected combination of said external terminals.

The configuration of interconnections provided by this arrangement allows for individual addressability of the LED modules within the string, without the need for direct external terminal connection(s) to the intermediate LED. Each possible combination of LEDs may be turned on or off through providing currents across one or more pairs of the four external terminals connected to the modules at the two ends of the string. This is achieved by connecting the intermediate LED module in series between the two terminal modules, such that each of its terminals makes connection with a single terminal of opposite polarity of one the two terminal modules. By this arrangement, a free conduction path exists in one direction along the string by which current may flow across all three modules, from the anode of a terminal module on one side to the cathode of a terminal module on the other. Additionally, however, due to the provision of external terminal connections also to the alternate terminals of each of these two end modules, there exist current paths along the string, in the same direction, which bypass one or both of these modules, through directing current directly to or from the intermediate module without previously, or subsequently, passing through the junction of a terminal module. The reverse bias diode characteristics of the terminal modules ensure that current does not flow across their terminals in these cases. By selectively configuring this collection of free and impeded current paths, any combination of LED modules on the string may be lit.

Since external terminal connections are required only to the two terminal (end) modules, applications utilising the invention need comprise no wiring elements which circumvent the end modules in order to reach the intermediate module, for example with wiring tracks running laterally parallel to the side of the string, or running beneath the string.

The LED modules may comprise a plurality of LEDs. This plurality of LEDs might for example be connected in a parallel circuit, such that the unit allows for individual addressability of groups of LED which are activated in concert.

The LED unit may further comprise a controller unit configurably coupled to the external terminals, and adapted to provide a current between a selected combination of said external terminals.

The controller 'selects' between the different lighting modes of the LED unit by providing positive and/or negative voltages to particular combinations of external terminals, thereby inducing currents across particular combinations of LED modules. For each mode, there exists at least one particular configuration of applied voltages which activates the group of LED modules corresponding to that mode.

According to a particular embodiment of the invention, there is provided a lighting device comprising:
a substrate layer;
an array of LED units, in accordance with any of the embodiments as described above, arranged on the substrate layer; and
a wiring layer, comprising one or more wiring elements electrically connected to the external terminals of the LED units, and distributed in a plane.

The strings of LED modules, belonging to the one or more LED units, are aligned together in contiguous rows or columns atop a shared substrate layer, such that the LED modules collectively comprise an array. By selectively providing currents across particular combinations of the external terminals of the array, any group of one or more of the LED modules may be activated.

According to the embodiment, there are external terminal connections provided only to LED modules at the ends of each string. Hence, external wiring need only make connection with the top and bottom edges of the array, and need not penetrate to any of the modules in the centre of the array. Hence, no wiring elements are required which run along the intermediary spaces between rows and columns of the LED modules—thereby minimising overall light-emitting area—and wiring elements may be distributed on a single planar level only.

The lighting device may further comprise a heat-sink layer thermally coupled to the substrate layer.

A heat sink layer helps in the dissipation of heat away from the array of LEDs. Heat cannot dissipate laterally, due to the close proximity of other LED modules. Hence heat must dissipate perpendicularly, 'downwards' through the substrate layer. A heat sink layer situated below the substrate layer, and having high thermal conductivity, assists in transmitting heat away from the matrix of LEDs to be dissipated externally.

The lighting device may have a spacing between adjacent LED modules in the array of, for example, between 0.03 mm and 0.07 mm using current technologies. As will be appreciated, in future technologies in which the size of individual LED modules is further reduced, a smaller minimal spacing may be achieved, as the teachings of the present invention are not limited to a particular technology.

The elimination of the need for wiring tracks running between columns of the array enables arrays having finer spacing between each component LED module. In particular, using current technologies, a spacing of between 0.03 mm and 0.07 mm is typically achievable in embodiments of the invention.

The lighting device may further comprise at least one controller unit configurably coupled to the external terminals of the LED units, and adapted to provide a current between a selected combination of said external terminals.

There may be provided for example a single controller unit, by which is controlled the lighting modes of all component strings of LED modules comprising the array. In this case, the device essentially comprises an integrated array of individually addressable LED modules, having a total of m*n modes, where m is the number of modes of a single string, and n is the number of strings comprising the array. Since for a string of 3 LED modules, there exist a total of eight unique lighting combinations, a corresponding 3×n array comprises a total of 8×n unique lighting modes.

Alternatively, there might be provided a plurality of controller units, for example, one for each string, or one for each small group of strings, where the group may be contiguous or non-contiguous. In the case of a plurality of controller units, there may still be provided a single higher-level controller unit, for co-ordinating output across the entire array.

The lighting device may further comprise one or more beam-shaping arrangements, positioned optically downstream from the LED modules, for performing a beam-shaping function.

The beam-shaping arrangements might comprise, for example, one or more lens arrangements, including, for instance, collimating lenses such as Fresnel structures, for generating directional beam outputs. This may be particularly applicable for applications such as automotive lighting where LED output is required which does not have the Lambertian distribution typical of standard LED arrangements, but rather high-contrast beam-like emission.

In one example, the beam-shaping arrangements might be arranged to direct light emitted by different LED modules into different directions.

Such an arrangement might be particularly applicable for example, in adaptive beam shaping applications, wherein a LED device comprising an array of LED modules is desired to have a beam output whose direction or shape is dynamically adaptable. Here, having a plurality of beam-shaping arrangements, configured to direct light in differing directions, arranged about the LED array, allows for one of a number of beam propagation angles to be selected from by merely activating those LED modules which coincide with the beam-shaping arrangement(s) adapted for propagation in that direction.

In this case, for example, each of the one or more beam-shaping arrangements may be positioned so as to be optically aligned with a contiguous subgroup of one or more of the LED modules.

In the simplest case, for example, the array is notionally divided into differing area sections, with there being provided for each area section a separate beam-shaping arrangement, adapted to direct light emitted from that section in a given particular direction. In this case, different portions of the array would be switched on for generation of beams of different propagation angles.

In the general case, the one or more beam-shaping arrangements may comprise one or more groups of beam-shaping arrangements, wherein members of a particular group are adapted so as to together generate a beam of a particular shape.

These groups may, as in the example above, comprise spatially contiguous groups, such that particular portions of the array correspond with beams of particular directions. However, in other examples, members of a particular group of beam-shaping arrangements may be distributed non-contiguously across the array of LED modules, for example in a systematic pattern which spans the surface of the array. In this case, beams having different directional angles may be propagated from the same apparent source area. This may be preferred in some lighting applications, where aesthetic considerations are important.

In some embodiments, the substrate layer may be a curved substrate. A curved substrate layer allows for a degree of beam shaping without the need for, or in addition to, optical beam-shaping elements.

The lighting device may form part of an automotive lighting unit.

In particular, an array of LED modules having groups of non-contiguously distributed optical arrangements, for adaptive beam-shaping functionality, may be incorporated within automotive front lighting.

BRIEF DESCRIPTION OF THE DRAWINGS

Examples of the invention will now be described in detail with reference to the accompanying drawings, in which.

DETAILED DESCRIPTION OF THE EMBODIMENTS

Aspects of the invention provide an interconnected string of three LED modules, having internal and external connections such that each LED in the string is fully individually addressable. LED biases and interconnects are oriented and configured such that individual addressability is achieved without the need for direct external signal connections to each LED in the string. Consequently embodiments are provided comprising pluralities of strings, arranged so as to form an array of LED modules, wherein wiring tracks running beneath, or along the intermediary spaces between, rows of LEDs are not required. Hence are provided LED devices comprising an array of individually addressable LED modules, having reduced spacing between rows and columns, and having optimal thermal path perpendicularly across the substrate layer. Provided devices have improved heat dissipation and greater achievable LED array density. Also provided are embodiments further comprising one or more beam-shaping arrangements, suitable, for example, for adaptive beam-shaping applications.

The invention utilises the reverse biases of LEDs within the string(s), in order to selectively deliver currents to intermediate LEDs within the string directly via terminals LEDs at the ends of the string, but with the option of bypassing the junctions of these LEDs, so as to leave them inactive. In this way intermediate LED(s) may be individually addressed, independently of other LEDs in the string, but without the need for direct external terminal connections to these modules.

Figure 1:
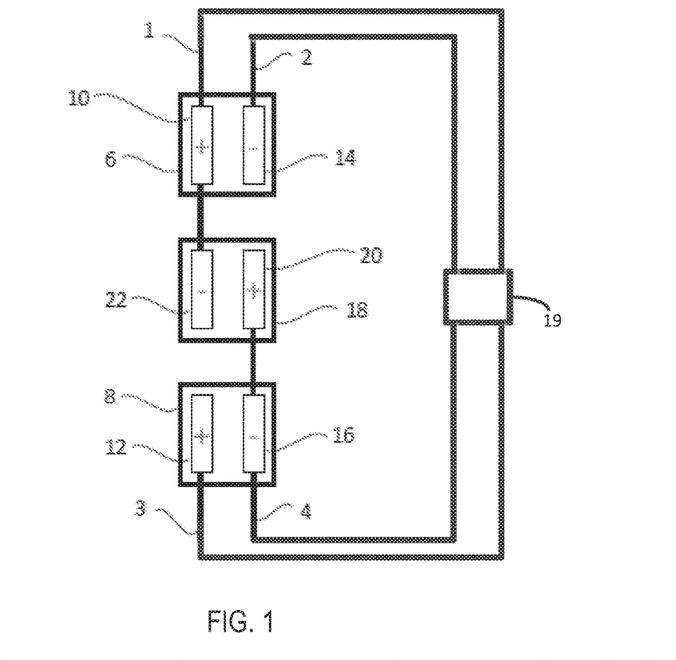
FIG. 1 shows an example of a LED unit in accordance with an embodiment.

In FIG. 1 is shown a simple example of a LED unit in accordance with an aspect of the invention. A string of three LED modules are connected in series. The string comprises two terminal LED modules 6, 8, at opposite ends of the string, and an intermediate LED module 18, connected in series between them. The first terminal LED module 6 comprises two external terminals 1, 2, which are electrically connected to the anode 10 and cathode 14 respectively of the LED module. Likewise, the second terminal LED module 8 comprises two external terminals 3, 4 connected to the anode 12 and cathode 16 respectively of the LED module. The intermediate LED module 18 is connected between the two terminal LED modules, with its cathode 22 connected to the anode 10 of the first terminal LED module and its anode 20 connected to the cathode 16 of the second terminal LED module.

In its broadest sense, the invention requires only that the intermediate LED module 18 be connected in series between the terminal LED modules 6, 8, with each of its terminals (anode 20 and cathode 22) connected to a terminal of opposite polarity. Hence the configuration of connections of the intermediate module of FIG. 1 might, in other examples, be inverted, such that the anode connects to the cathode 14 of the top terminal LED, and the cathode connects to the anode 12 of the second terminal LED. Indeed, note that said alternate arrangement is equivalently achieved by merely rotating the unit of FIG. 1, such that the second terminal LED 8 is at the top of the string and the first terminal LED 6 is at the bottom of the string.

In the particular example depicted by FIG. 1, the unit comprises a string of single LEDs. However, in other examples, the unit comprises a string of LED modules, wherein a LED module may in general comprise a plurality of individual LEDs. For example, a LED module might comprise an arrangement of a number of LEDs, connected in parallel, and the entire arrangement is the individually addressable element within the string.

Note that in describing examples and embodiments of the invention, the terms 'LED' and 'LED module' may be used interchangeably. Where this is done, it is merely for brevity and ease of explanation, and use of one term rather than the other is not to be understood as limiting. For all embodiments, the most general case comprises LED modules, wherein a LED module may comprise one or more individual LEDs. However in the simple examples here described, the LED modules typically comprise just a single LED, and hence, for simplicity of description, 'LED module' is often substituted simply for 'LED'.

Figure 2:
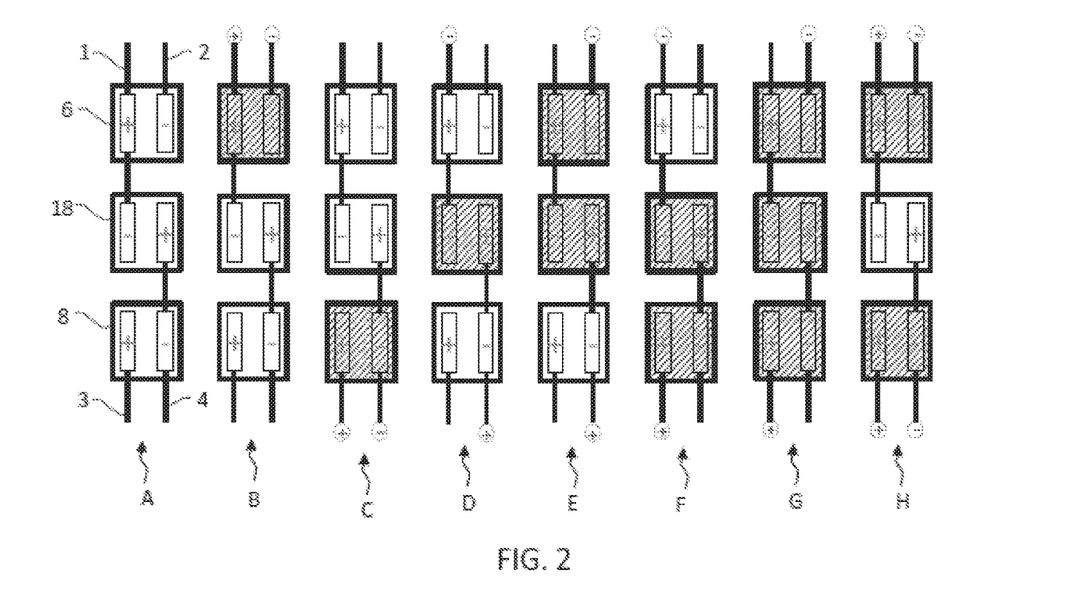
FIG. 2 shows the eight lighting modes of the example LED unit in accordance with an embodiment.

Each possible combination of lit and unlit LED modules is realised by providing voltages of differing polarities across certain combinations of the external terminals 1, 2, 3, 4. In FIG. 2 are depicted the eight possible lighting modes (labeled A-H) of the embodiment of FIG. 1, wherein hatching indicates a LED which is active according to the mode, and non-hatching indicates a LED which is inactive. For each mode, the four external terminals 1-4 are shown, and the configuration of applied voltages necessary for realising the mode indicated by + and − signs at the ends of each of the terminals which are electrically active within the mode.

For example, mode B, as indicated by the second string in FIG. 2, corresponds to a configuration in which the first terminal LED module is lit, and the other two modules are unlit. The mode is realised by providing positive relative voltage to terminal 1, and negative relative voltage to terminal 2 (i.e. by providing a potential difference between 1 and 2, with the greater potential at 1), thereby inducing a current to flow from terminal 1 to terminal 2 via the junction of terminal LED 6. The other two terminals are left unconnected (i.e. open) and hence no current flows across the junctions of either terminal LED 18 or intermediate LED 8.

A full outline of electrical configurations corresponding to each of modes A-H is given in Table 1 below, wherein '+' indicates positive constant current source (or positive relative voltage), '−' indicates negative constant current source (or negative relative voltage), and '0' indicates a terminal which is unconnected (i.e. open).

TABLE 1

Electrical configurations corresponding to lighting modes A-H according to an aspect of the invention

|  |  | Mode | | | | | | | |
|---|---|---|---|---|---|---|---|---|---|
|  |  | A | B | C | D | E | F | G | H |
| Terminal | 1 | 0 | + | 0 | − | 0 | − | 0 | + |
|  | 2 | 0 | − | 0 | 0 | − | 0 | − | − |
|  | 3 | 0 | 0 | + | 0 | 0 | + | + | + |
|  | 4 | 0 | 0 | − | + | + | 0 | 0 | − |

Note that for some of the modes, there exist alternate electrical configurations which would equivalently realise the same arrangement of lit and unlit LEDs. However, for brevity, only one possible electrical configuration will be described or listed in relation to each of the eight lighting modes.

As discussed above, according to the inventive wiring configuration, there exists a free conduction path across the entire length of the string, such that current may flow across the junctions of all three LED modules 8, 18, 6, from terminal 3 at one end, to terminal 2 at the other. This arrangement is represented by mode G and shown schematically in FIG. 2. On this arrangement, all three LED modules are lit, and current is provided across intermediate LED 18 via the junctions of terminal LED modules 6 and 8.

However, as also discussed above, intermediate LED 18 may be addressed individually, without activating the terminal LEDs, by directing current through the alternate of each of the two pairs of external terminals, thereby by-passing the junctions of one or both of the terminal LED modules. In mode E, for example, the electrical configuration is the same as that corresponding to mode G, except that the positive current source is directed through terminal 4, instead of terminal 3. The consequence of this change is that positive current is able to reach the anode of intermediate LED 18, without first passing through the junction of LED 8. Accordingly, in this configuration, LED 8 remains unlit, while LEDs 18 and 6 are lit.

Similarly, mode D differs from mode E in that the negative source of current is provided to terminal 1, instead of terminal 2. As a result, current is able to flow from the cathode of intermediate LED 18, and complete the circuit across it, without passing across the junction of terminal LED 6. Accordingly, in this configuration, both LEDs 8 and 6 remain unlit, while intermediate LED 18 is active.

Hence, by selectively alternating electrical connections at each end of the string, between the two of each pair of external terminals, the intermediate LED may be lit singly, or in combination with either one, or both of the terminal LEDs.

Alternatively, terminal LEDs 6, 8 may themselves be independently addressed, without activating the intermediate LED 18, by providing currents directly across the corresponding pair of external terminals. In mode C for example, terminal LED 8 is activated singly, through directing current directly between terminal 3 and terminal 4, and therefore across the junction of LED 8, but not across the junctions of any of the other LEDs. LED 6 is likewise activated individually in mode B.

The LED unit might further comprise a controller unit 19, shown in FIG. 1, being configurably coupled to the external terminals, and able to deliver voltages to each of them, in accordance with the electrical configurations corresponding to the various lighting modes. The controller unit 19 might, for example, incorporate a user interface element, such that a user is able to switch between the various possible lighting modes. Such an embodiment could therefore function independently as a stand-alone device. Alternatively, the controller unit 19 might make further connection to an additional (external) controller unit, for example a computer controller, or simply a higher level controller. In simpler embodiments, however, the unit may comprise no controller unit at all, but rather comprise simply the string of FIG. 1, this incorporated within a broader device, already comprising a controller of its own. In this case, in addition to functioning as a component within said broader device, the string itself might be sold or distributed as a unit on its own, as a part for repair or upgrade for example.

As discussed above, an important advantage of the interconnect arrangement provided by at least some aspects of the invention is the capacity it confers to individually address LED modules within the string without the need for direct external signal connections to each module. This carries a particularly significant advantage in the case of embodiments comprising pluralities of the LED strings; in particular, embodiments which combine strings contiguously to form an array of individually addressable LED modules. In these cases, arrays of LEDs are possible having wiring elements which occupy only a single planar level, and which run only to the sides of any array, not needing to penetrate into the centre. Hence, wiring tracks are not required to run in between rows or columns, thereby saving valuable space, and allowing for a much finer pitch to be achieved.

Figure 3:
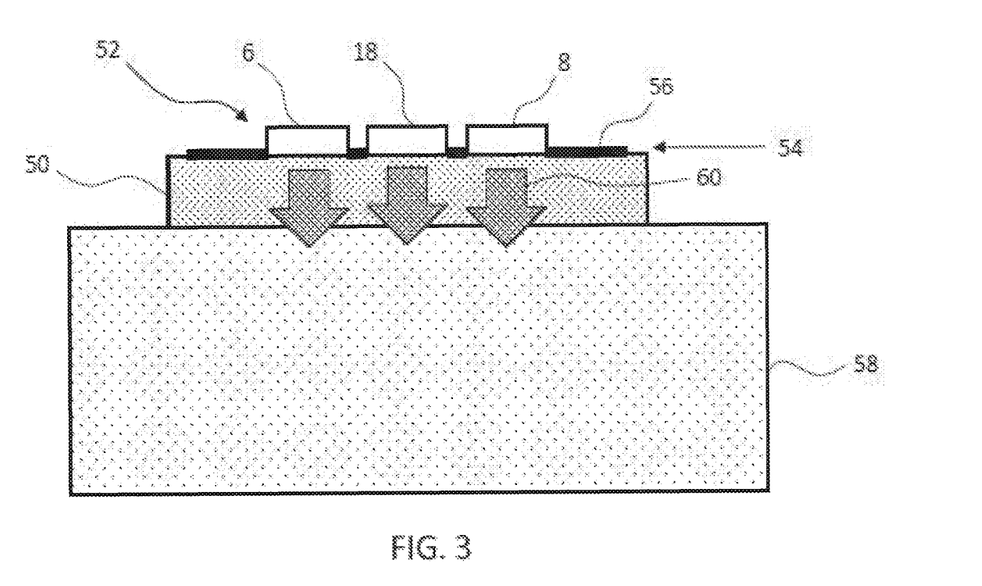
FIG. 3 shows a first example of a LED device in accordance with an embodiment, comprising a 3×n array of LED modules.

In FIG. 3 is shown an example of a lighting device in accordance with an embodiment, comprising a plurality of LED units, arranged to form columns (or rows) in an array 52 of LED modules. The LED units are disposed atop a shared substrate layer 50. In the particular example of FIG. 3, there is additionally provided, beneath the substrate layer, a heat sink layer 58, the two being thermally coupled. Heat generated by the array 52 conducts perpendicularly across the substrate layer (as indicated by arrows 60), and is transferred into the adjacent heat-sink layer. The heat sink layer may have comparatively large volume and surface area, allowing heat to dissipate through its surfaces to external surroundings.

Depending on intended applications however, in some embodiments a dedicated heat sink layer might be omitted. For example, the substrate layer 50 might itself be composed of or include a material having coefficient of thermal conductivity sufficiently large as to render a heat sink unnecessary. Or in alternative examples, the device might, for instance, be incorporated within a larger arrangement, already comprising elements dedicated to heat dissipation.

As shown in FIG. 3, external terminal connections are required only at terminal modules 6, 8, situated at the ends of each string of LEDs, and hence external wiring elements 56 need only run to the top and bottom of each column (or row) of the array. This means that there are no wiring elements running in between different strings of the array, or running underneath terminal LEDs, at a different level of the substrate. Intermediate LED module 18 receives source current indirectly via lateral connections with the terminal modules.

Figure 4:
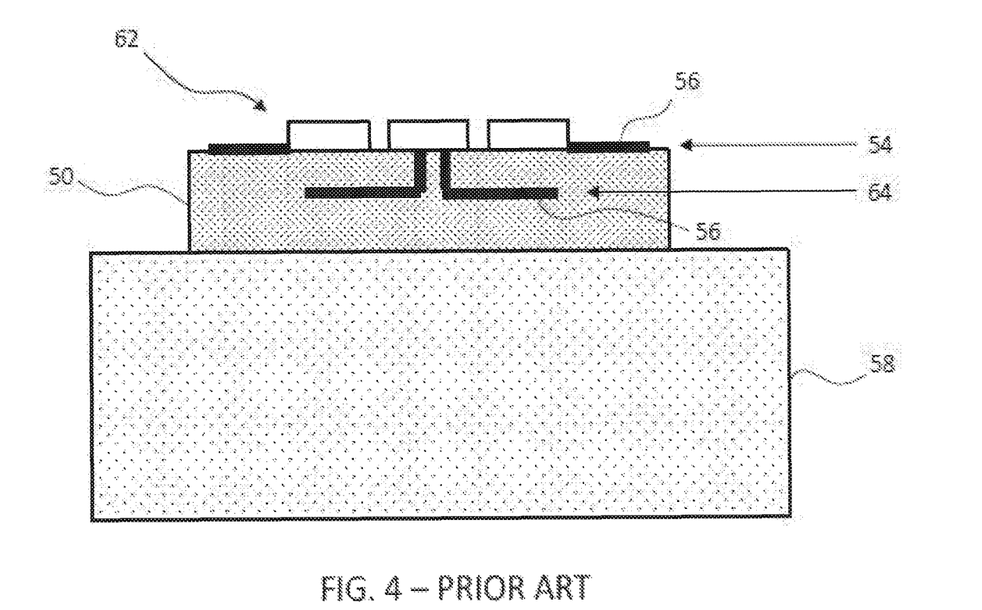
FIG. 4 shows a schematic illustration of an example of a LED device as known in the art.

In FIG. 4 is shown a schematic diagram of an analogous lighting device to that of the embodiment of FIG. 3, comprising an example of an individually addressable LED array 62 as known in the art. In this example, all modules within the array require direct external voltage connection, and to this end wiring elements 56 run at two distinct planar levels 54, 64, the intermediate LED being fed by wiring elements which run underneath the two end LEDs which surround it. In this case, however, the second wiring layer 64 must run laterally through the centre of the substrate layer, thereby impeding the thermal path between the array 62 and the heat sink layer 58. Due to the density of the array, heat cannot effectively dissipate laterally, but must mainly dissipate perpendicularly (i.e. vertically in this case). However, this requires a sufficient thermal path from the LED modules to the heat sink. The second wiring layer 64 of the state of the art example of FIG. 4 significantly limits the efficiency of heat dissipation, resulting either in diminished the overall performance of the device, or alternatively the necessity to impose undesired design constraints thereon, in terms, for example, of module spacing required for acceptable thermal performance. Additionally, extra wiring layers lead to increased cost and increased reliability concerns (due primarily to the necessity to include vias for making connection to internal layers).

By contrast, the example of FIG. 3 features only a single wiring layer, 54, which occupies a plane parallel with the top surface of the substrate layer 50. The substrate layer incorporates no wiring elements within its bulk, and hence an optimal thermal path is maintained between the LED array 52 and the heat sink layer 58 beneath.

Figure 5:
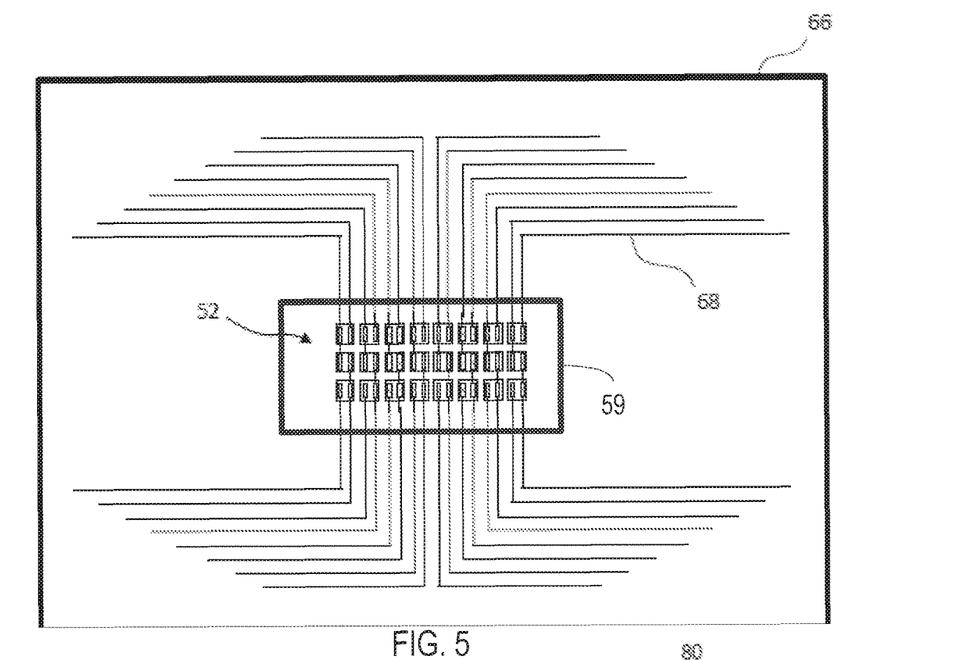
FIG. 5 shows a schematic diagram of an example wiring layout for the first LED device example.

In FIG. 5 is a schematic diagram showing more clearly an example wiring arrangement corresponding to the embodiment depicted in FIG. 3. The LED array 52, along with the substrate layer 59 and heat sink layer (not shown) sit atop a circuit board 66, and wiring elements 68 run from the terminal modules of each string of LEDs. The array comprises eight columns of three LEDs, and hence there are a total of sixteen external connections to each of the top and bottom of the array, two connections to each terminal module. In other examples, the array may be extended to comprise as many columns as are desired, with an additional four external connections required for each column added. The wiring elements 68 may, for example, subsequently make connection with terminals of a controller unit, adapted to configurably apply a current between selected combinations of the external terminals to which the wiring elements are connected.

The absence of wiring tracks running along intermediary spacings between strings allows for arrays having narrower spacing between columns/rows, and consequently arrays having greater density of LED modules. Greater density of LED modules increases intensity of light output, since light emitting area for a given power output is reduced. In one example—using current technologies—spacing between adjacent LED modules of between 0.03 mm and 0.07 mm is achieved.

In certain embodiments, a lighting device having an array of LED units arranged atop a substrate layer might further comprise one or more controller units configurably coupled to the external terminals of the LED units for providing a current between a selected combination of said external terminals. There might be provided a single controller unit, for example, by means of which the lighting modes of each one of the strings is centrally controlled. In this case, the strings together properly form a fully individually addressable array of LED modules, having a total of m*n modes, wherein n is the number of strings and m is the number of modes of each string (i.e. eight for 3*n array).

In alternative examples, however, the lighting device might comprise a plurality of controller units, for example, one unit per string, or one for each small group of strings, where the group may be contiguous or non-contiguous. In the case of a plurality of controller units, there might still be provided a single higher-level controller unit, for co-ordinating output across the entire array.

For certain applications, such as for example automotive front lighting, it is desirable for lighting devices to generate emission which is highly directional, rather than the Lambertian output of a standard LED arrangement. To this end, in some examples, the lighting devices described above may further comprise one or more beam-shaping arrangements, positioned optically downstream from the LED modules of the array, for performing a beam-shaping function. The beam-shaping arrangements might comprise, for example, one or more lens arrangements, such as for instance, Fresnel lenses, which act so as to refract light rays in proportion to their angle of incidence, and thereby generate a collimated beam of parallel rays, one or more collimator arrangements, one or more reflector arrangements or combinations of such arrangements.

Figure 6A:
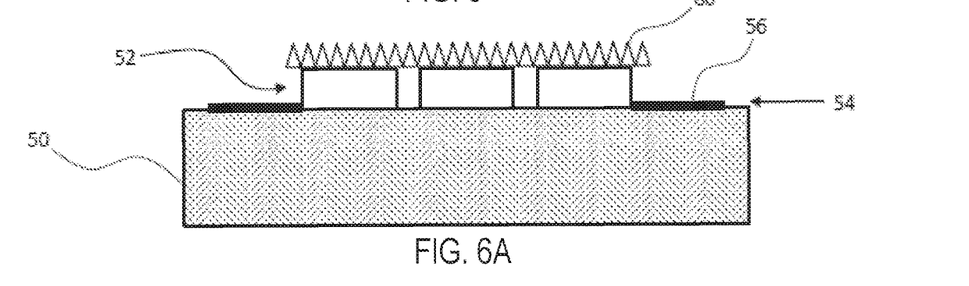
FIG. 6 shows a second example of a LED device in accordance with another embodiment.

In FIG. 6A is shown a simple example of such a device, having an array 52 of LED modules in accordance with an embodiment, these arranged atop a substrate layer 50, with a single wiring layer 54. Optically downstream from the LED array is a beam-shaping arrangement 80. This arrangement may take the form of a Fresnel plate, as shown in the figure, but may in other examples comprise different varieties of lens, or other beam-shaping elements, in different configurations.

Figure 6B:
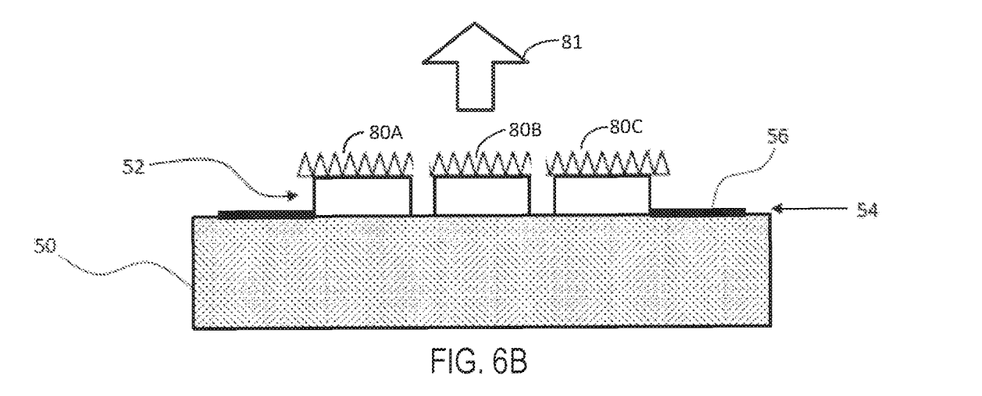

In the example of FIG. 6A, a single beam-shaping arrangement 80 is positioned atop the entire array 52. In other examples however, such as shown in FIG. 6B, the device might. comprise a plurality of beam-shaping arrangements 80A, 80B, and 80C, and in particular, arrangements arranged to direct light emitted by different LED modules into different directions.

Such an arrangement might be particularly applicable for example, in adaptive beam shaping applications, wherein a single LED device comprising a single array of LED modules is desired to have a beam output 81 whose direction or shape is dynamically adaptable.

Here, having a plurality of beam-shaping arrangements, configured to direct light in differing directions, arranged about the LED array, allows for one of a number of beam propagation angles to be selected from by merely activating those LED modules which coincide with the beam-shaping arrangement(s) adapted for propagation in that direction.

In this case, for example, each of the one or more beam-shaping arrangements may be positioned so as to be optically aligned with a contiguous subgroup of one or more of the LED modules. In the simplest case, for example, the array is notionally divided into differing area sections, with there being provided for each area section a separate beam-shaping arrangement, adapted to direct light emitted from that section in a given particular direction. In this case, different portions of the array would be switched on for generation of beams of different propagation angles. For example, in the case of automotive front lighting, a device might comprise a beam-shaping arrangement positioned over a 'top' area section, and a beam-shaping arrangement positioned over a 'bottom' area section, wherein the top beam-shaping arrangement is adapted to direct light at a greater polar angle than the bottom arrangement. By selectively switching on either the top or the bottom area section of the array, a 'downward' or 'upward' pointing beam may in this case be generated.

In the more general case, the one or more beam-shaping arrangements may notionally be divided into one or more groups of beam-shaping arrangements, wherein members of a particular group are adapted so as to together generate a beam of a particular shape. These groups may, as in the example above, comprise contiguous area-based groups, such that particular portions of the array correspond with beams of particular directions. However, in other examples, members of a particular group of beam-shaping arrangements may be distributed non-contiguously across the array of LED modules, for example in a systematic pattern which spans the surface of the array. In this case, beams having different directional angles may be propagated from the same apparent source area. This may be preferred in some lighting applications, where aesthetic considerations are important. For automotive front lighting, for example, such an arrangement would allow a headlight unit to dynamically generate beams of differing angles, but wherein for all angles, the beam appears to originate from sources across the entire array surface. Hence, the general appearance of the light-emitting surface of the lighting device is indistinguishable for different generated beam profiles.

Other beam-shaping features might be alternatively or additionally be incorporated. In one example, the array might be coupled to a substrate having a curved surface, thereby producing a device having an intrinsically directional light-emitting surface.

In other examples, there might be provided additional optical elements above or in place of lens arrangements, such as for instance one or more collimating funnels. A collimating funnel positioned optically downstream from a Fresnel plate, for example, assists in generating beam outputs having high contrast at beam edges (i.e. sharply defined beam boundaries).

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An LED unit comprising:
a string of LED modules comprising:
a pair of terminal LED modules at opposite ends of the string, each of the terminal LED modules comprising two external terminals connected to an anode and cathode respectively of each of the terminal LED modules, the two external terminals of each of the terminal LED modules being configured to be coupled to a controller unit; and
an intermediate LED module having an anode connected to the cathode of one of the terminal LED modules and a cathode connected to the anode of the other of the terminal LED modules, such that any combination of the intermediate LED module or the terminal LED modules can be switched on by providing a current by the controller unit between a selected combination of only the external terminals.

2. The LED unit of claim 1, wherein at least one of the intermediate LED module or at least one of the terminal LED modules comprises a plurality of LEDs.

3. The LED unit of claim 1, further comprising the controller unit coupled to the external terminals to provide the current between the selected combination of the external terminals.

4. The LED unit of claim 1, further comprising:
a substrate layer;
at least one additional LED unit arranged on the substrate layer; and
a wiring layer, comprising one or more wiring elements electrically connected to at least some of the external terminals.

5. The LED unit of claim 4, further comprising a heat-sink layer that is thermally coupled to the substrate layer.

6. The LED unit of claim 5, wherein at least a portion of the LED unit forms part of an automotive lighting unit.

7. The LED unit of claim 4, wherein a spacing between adjacent LED modules is between 0.03 mm and 0.07 mm.

8. The LED unit of claim 4, further comprising one or more beam-shaping arrangements, positioned optically downstream from the LED modules, the one or more beam-shaping arrangements to perform a beam-shaping function.

9. The LED unit of claim 8, wherein at least one of the one or more beam-shaping arrangements is optically aligned with a contiguous subgroup of one or more of the LED modules.

10. The LED unit of claim 9, wherein the one or more beam-shaping arrangements are arranged to direct light emitted by different LED modules into different directions.

11. The LED unit of claim 10, wherein the one or more beam-shaping arrangements comprise one or more groups of beam-shaping arrangements, and wherein members of a particular group are adapted so as to together generate a beam of a particular shape.

12. The LED unit of claim 11, wherein members of at least some of the one or more groups of beam-shaping arrangements are distributed non-contiguously.

13. The LED unit of claim 11, wherein the one or more groups of beam-shaping arrangements are such that individual ones of the one or more groups of beam-shaping arrangements correspond with beams of particular directions.

14. The LED unit of claim 9, wherein the beam-shaping arrangements comprise one or more lens arrangements.

15. The LED unit of claim 14, wherein the one or more lens arrangements comprise at least one collimating lens.

16. The LED unit of claim 15, wherein collimating lens comprises Fresnel structures.

17. The LED unit of claim 4, wherein the substrate layer is a curved substrate.

18. The LED unit of claim 4, further comprising at least one further LED unit in an arrangement.

19. The LED unit of claim 18, wherein the arrangement is an array.

* * * * *